(12) United States Patent
Gleich

(10) Patent No.: US 7,508,208 B2
(45) Date of Patent: Mar. 24, 2009

(54) MAGNETIC RESONANCE IMAGING SCANNER WITH BOOSTER IRON

(75) Inventor: Bernhard Gleich, Hamburg (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 240 days.

(21) Appl. No.: 10/598,462

(22) PCT Filed: Feb. 17, 2005

(86) PCT No.: PCT/IB2005/050602

§ 371 (c)(1),
(2), (4) Date: Aug. 31, 2006

(87) PCT Pub. No.: WO2005/088331

PCT Pub. Date: Sep. 22, 2005

(65) Prior Publication Data

US 2007/0273376 A1    Nov. 29, 2007

Related U.S. Application Data

(60) Provisional application No. 60/549,732, filed on Mar. 3, 2004.

(51) Int. Cl.
*G01V 3/00* (2006.01)
(52) U.S. Cl. .................. 324/318; 324/309; 324/320
(58) Field of Classification Search ......... 324/300–322; 600/407–435
See application file for complete search history.

(56) References Cited

U.S. PATENT DOCUMENTS

| | | | |
|---|---|---|---|
| 4,631,481 A | 12/1986 | Young et al. | |
| 4,771,243 A | 9/1988 | Vreugdenhil et al. | |
| 6,294,972 B1 | 9/2001 | Jesmanowicz et al. | |
| 6,627,003 B2 | 9/2003 | Hayworth et al. | |
| 7,075,300 B2* | 7/2006 | Kolbeck et al. | 324/318 |
| 7,098,661 B2* | 8/2006 | Nistler et al. | 324/318 |
| 7,202,667 B2* | 4/2007 | Barbic | 324/318 |
| 2003/0075243 A1 | 4/2003 | Hayworth et al. | |
| 2005/0030030 A1* | 2/2005 | Kolbeck et al. | 324/318 |
| 2005/0073311 A1* | 4/2005 | Nistler et al. | 324/318 |

FOREIGN PATENT DOCUMENTS

| | | | |
|---|---|---|---|
| EP | 0 737 867 A1 | 10/1996 |
| EP | 1 193 507 A2 | 4/2002 |
| EP | 1 260 827 A2 | 11/2002 |

* cited by examiner

*Primary Examiner*—Brij B. Shrivastav
*Assistant Examiner*—Tiffany A Fetzner

(57) ABSTRACT

A magnetic resonance imaging scanner includes a magnet (20) generating a temporally constant magnetic field, magnetic field gradient-generating structures (30) superimposing selected magnetic field gradients on the temporally constant magnetic field, and a radio frequency coil (32) producing a radio frequency field. A magnetic field-modifying structure (60) disposed inside a radio frequency shield (64) includes dispersed particles of magnetic material ($70_1$, $70_2$, $70_3$, $70_4$) that enhance the temporally constant magnetic field. The particles are generally smaller in at least one dimension than a skin depth of the radio frequency field in the magnetic material. The magnetic field-modifying structure has a longitudinal demagnetization factor ($N_z$) parallel to the temporally constant magnetic field and a tangential demagnetization factor ($N_T$) in a tangential direction transverse to the temporally constant magnetic field. The longitudinal demagnetization factor is larger than the tangential demagnetization factor to produce tangential flux guiding.

18 Claims, 7 Drawing Sheets

Figure 1:
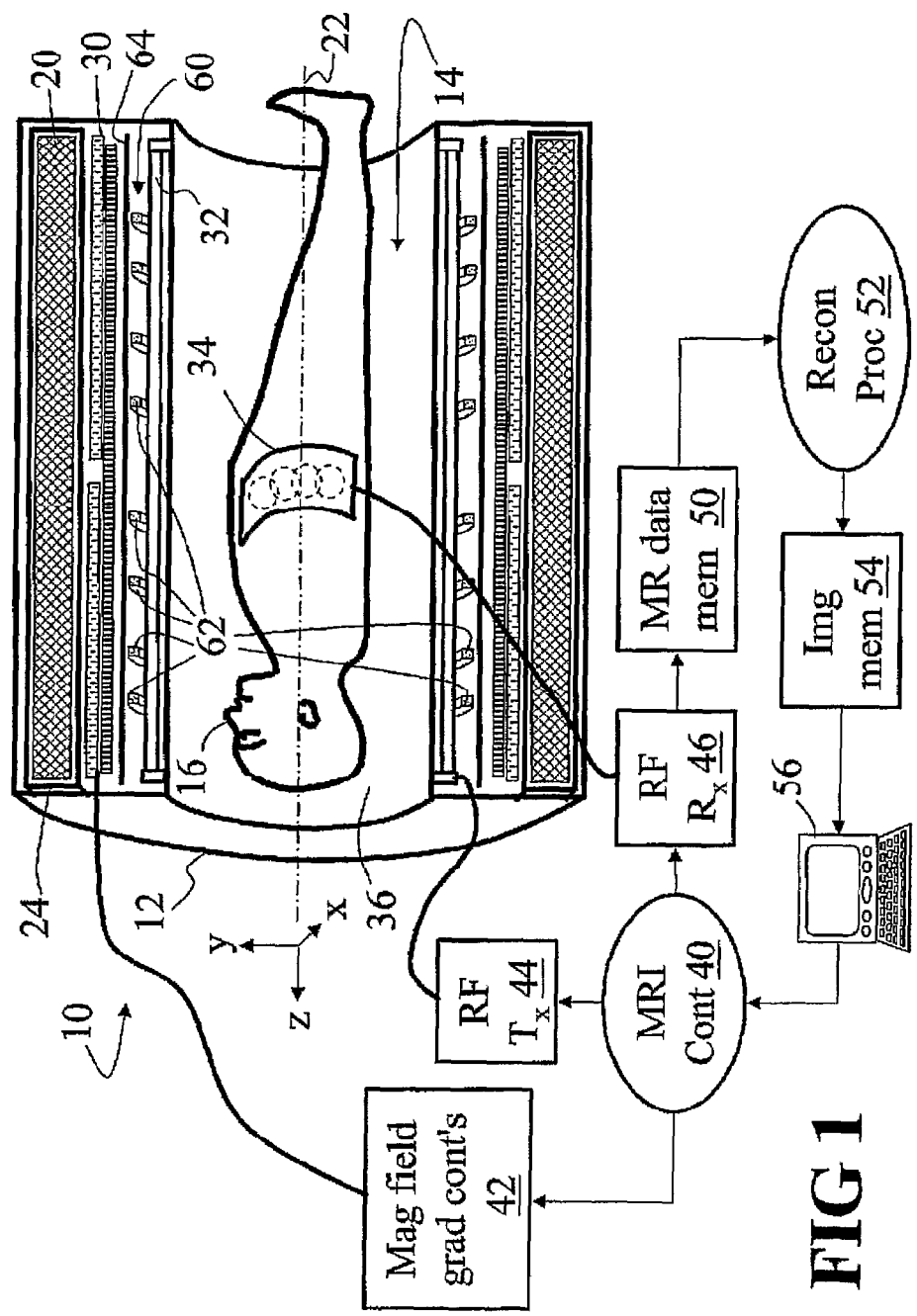

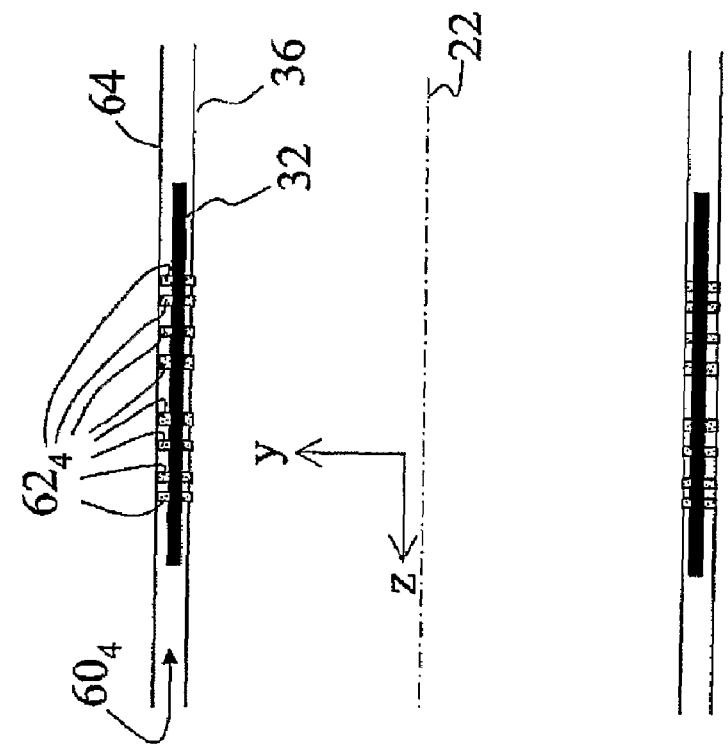
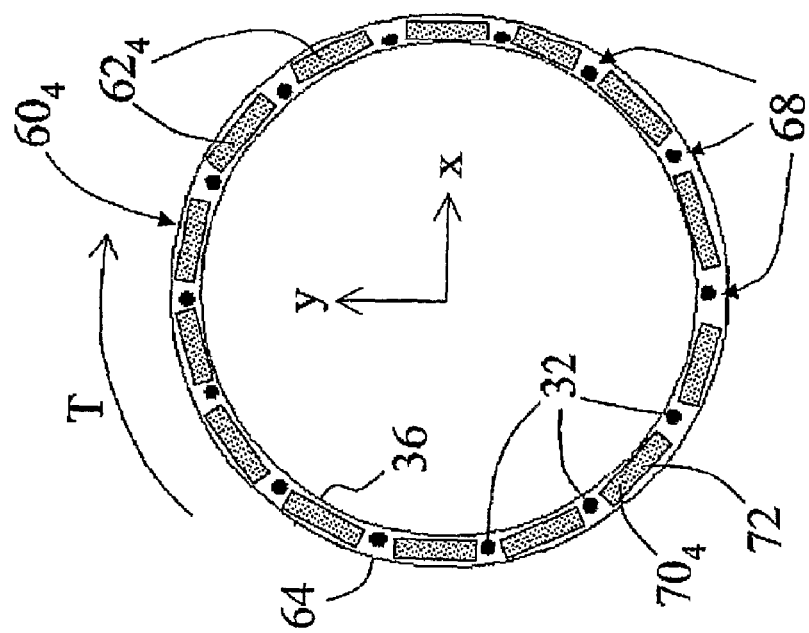
FIG 5A
FIG 5B

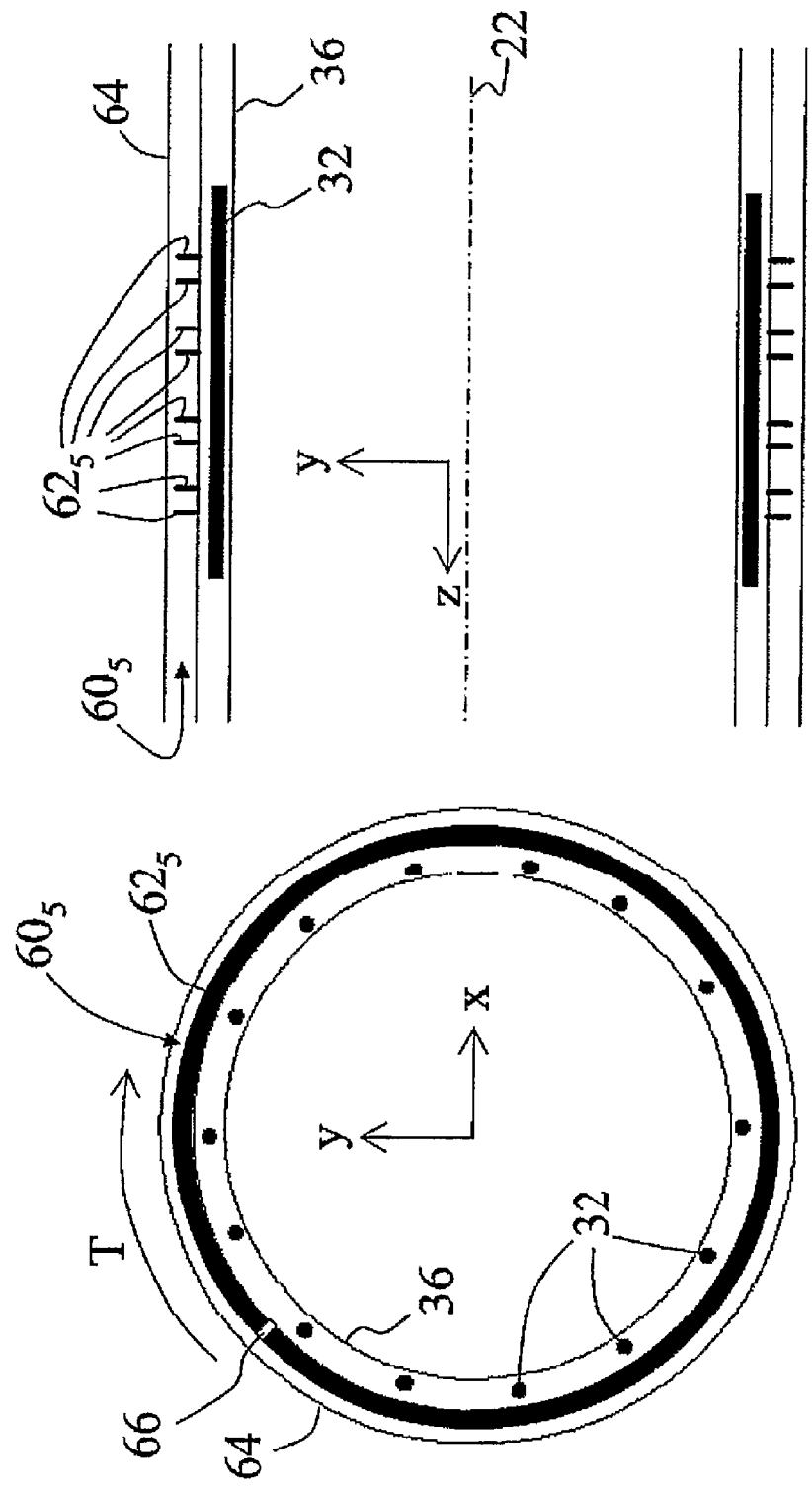

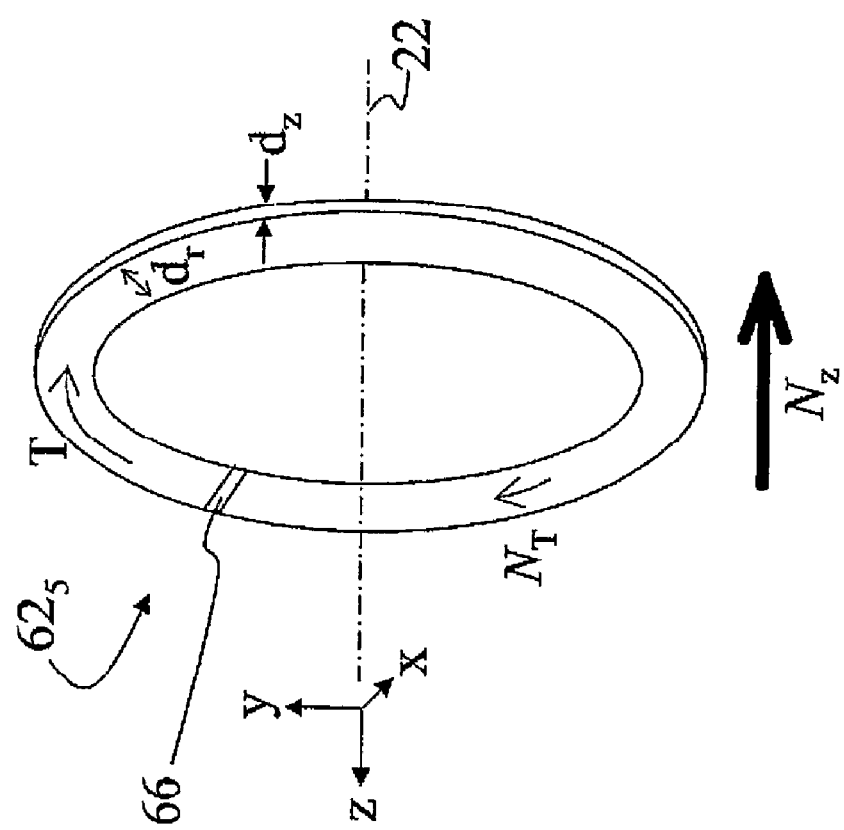

MAGNETIC RESONANCE IMAGING SCANNER WITH BOOSTER IRON

CROSS REFERENCE TO RELATED APPLICATIONS

This application claims the benefit of U.S. provisional application Ser. No. 60/549,732 filed Mar. 3, 2004, which is incorporated herein by reference.

DESCRIPTION

The following relates to the magnetic resonance arts. It finds particular application in magnetic resonance imaging, and will be described with particular reference thereto. However, it also finds application in magnetic resonance spectroscopy and other techniques that benefit from a substantially uniform main $B_0$ magnetic field.

Magnetic resonance imaging scanners with magnet bores that are short in the axial or z-direction reduce patient claustrophobia and can provide improved access to the patient for interventional procedures. A short bore magnet may, for example, have bore length of less than 1.5 meters, or less than 1 meter. Short-bore magnets, however, typically have degraded static main $B_0$ magnetic field spatial uniformity as compared with longer bore magnets, due to field bending at the ends of the short bore.

One approach for improving field uniformity is the use of "booster" iron. In this approach, a magnetic field-modifying structure includes iron or another ferromagnetic material that is coupled with the main $B_0$ magnetic field. The magnet coils are designed in conjunction with the magnetic field-modifying structure, such that the main magnet and the magnetic field-modifying structure together produce a substantially spatially uniform static main $B_0$ main magnetic field. The booster iron stretches the magnetic field to compensate for the reduced bore length. Moreover, as the booster iron is typically in saturation at typical main $B_0$ magnetic field magnitudes (e.g., at 1.5 T or higher), the effect of the booster iron on the static main $B_0$ magnetic field is substantially independent of magnetic field gradients. Instead of designing the booster iron concurrently with the magnet, the booster iron can be designed empirically after magnet manufacture by adding iron to improve uniformity, stretch the field, or otherwise improve the main $B_0$ magnetic field in the already-manufactured magnet.

In some designs, the magnetic field-modifying structure is placed outside of the radio frequency coil and the radio frequency shield that shields surrounding structures from the radio frequency signals. This approach substantially reduces interaction between the booster iron and the radio frequency fields. However, placing the booster iron outside the radio frequency shield has certain disadvantages. Space constraints in the scanner can make placement of the booster iron outside the radio frequency shield difficult. Moreover, the booster iron is less effective at modifying the main $B_0$ magnetic field in the imaging region as the booster iron is moved further away from the imaging region. Thus, more booster iron is required, which occupies additional space in the bore.

Moving the booster iron closer to the imaging volume by placing it inside of the radio frequency shield is problematic. Inside the shield, the booster iron interacts with and can degrade the radio frequency $B_1$ magnetic field. The skin depth in iron of the radio frequency $B_1$ magnetic field at typical magnetic resonance imaging frequencies is small, being typically of order 10-20 microns or less. Consequently, the radio frequency $B_1$ magnetic field is substantially expelled from the interior of the booster iron. This field expulsion causes the radio frequency coil to operate less efficiently, and can cause non-uniformities in radio frequency fields. Moreover, eddy currents induced in the booster steel by the radio frequency fields can produce magnetic field distortions, image artifacts, and detrimental heating inside the scanner.

The present invention contemplates an improved apparatus and method that overcomes the aforementioned limitations and others.

According to one aspect, a magnetic resonance imaging scanner is disclosed. A magnet generates a temporally constant magnetic field. One or more magnetic field gradient-generating structures superimpose selected magnetic field gradients on the temporally constant magnetic field. A radio frequency coil is disposed inside of a radio frequency shield and selectively produces a radio frequency field. A magnetic field-modifying structure is designed to enhance the temporally constant magnetic field. The magnetic field-modifying structure is disposed inside of the radio frequency shield, and includes particles of magnetic material generally smaller in at least one dimension than a skin depth of the radio frequency field in the magnetic material dispersed in an insulating binder.

According to another aspect, a magnetic resonance imaging scanner is disclosed. A magnet generates a temporally constant magnetic field. One or more magnetic field gradient-generating structures superimpose selected magnetic field gradients on the temporally constant magnetic field. A radio frequency coil selectively produces a radio frequency field. A magnetic field-modifying structure is designed to enhance the temporally constant magnetic field. The magnetic field-modifying structure has a longitudinal demagnetization factor parallel to the temporally constant magnetic field and a tangential demagnetization factor in a tangential direction transverse to the temporally constant magnetic field. The longitudinal demagnetization factor is larger than the tangential demagnetization factor to produce tangential flux guiding.

One advantage resides in reducing space consumption in a magnetic resonance imaging scanner.

Another advantage resides in improved radio frequency coil operating efficiency.

Yet another advantage resides in providing preferential flux guiding in the tangential direction.

Still yet another advantage resides in reduced eddy current losses.

Numerous additional advantages and benefits will become apparent to those of ordinary skill in the art upon reading the following detailed description of the preferred embodiments.

The invention may take form in various components and arrangements of components, and in various process operations and arrangements of process operations. The drawings are only for the purpose of illustrating preferred embodiments and are not to be construed as limiting the invention.

FIG. 1 diagrammatically shows a magnetic resonance imaging system including a magnetic field-modifying structure disposed between the radio frequency shield and rungs of a birdcage radio frequency coil.

Figure 2A:
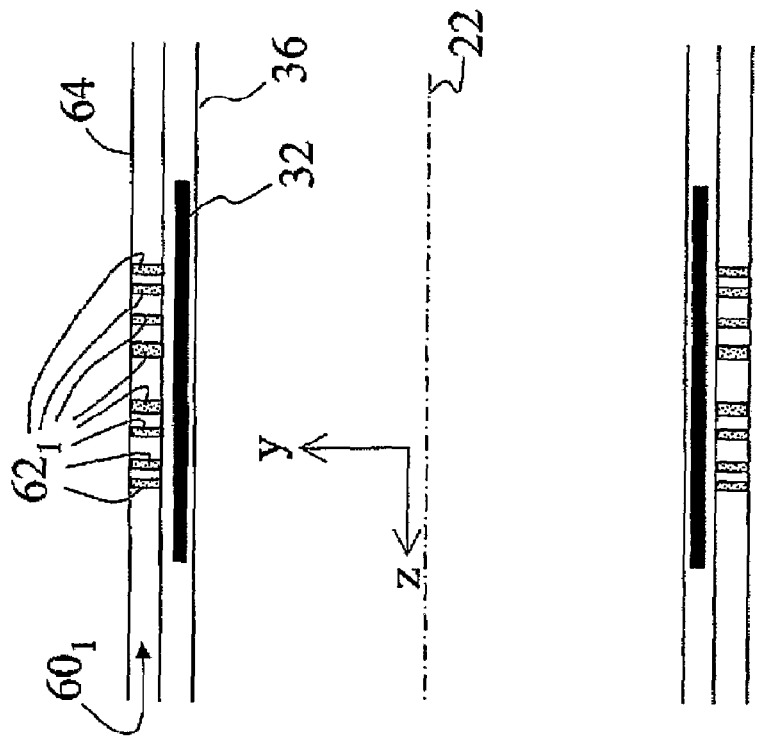
Figure 2B:
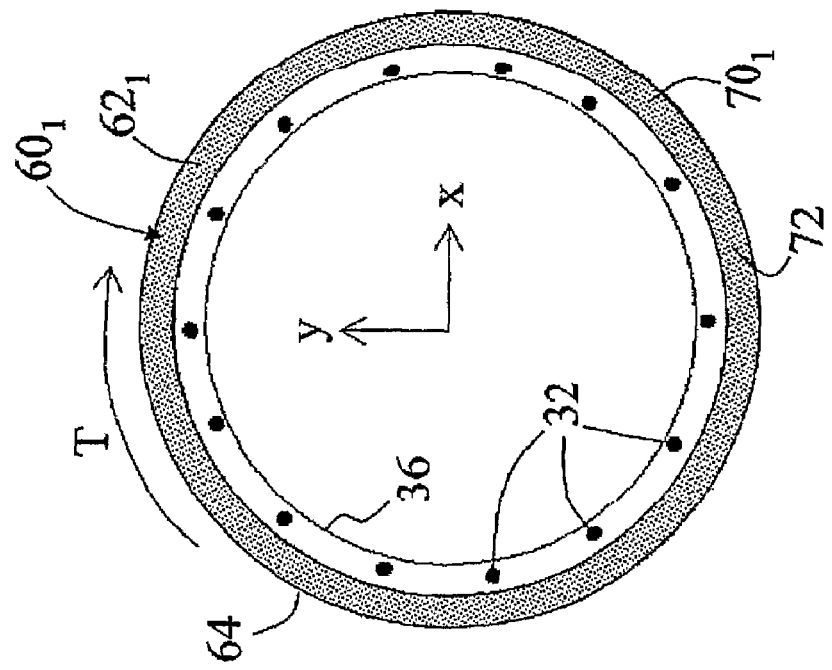

FIGS. 2A and 2B diagrammatically show end and side sectional views of a radio frequency birdcage coil with a magnetic field-modifying structure disposed between the birdcage rungs and the radio frequency screen, in which the magnetic field-modifying structure includes ferromagnetic particles dispersed in an insulating binder.

Figure 3A:
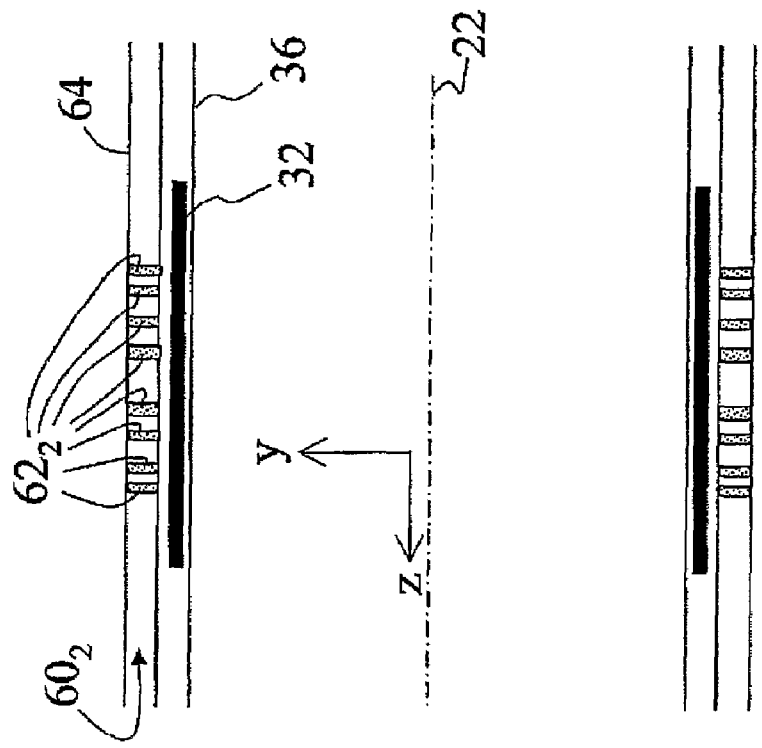
Figure 3B:
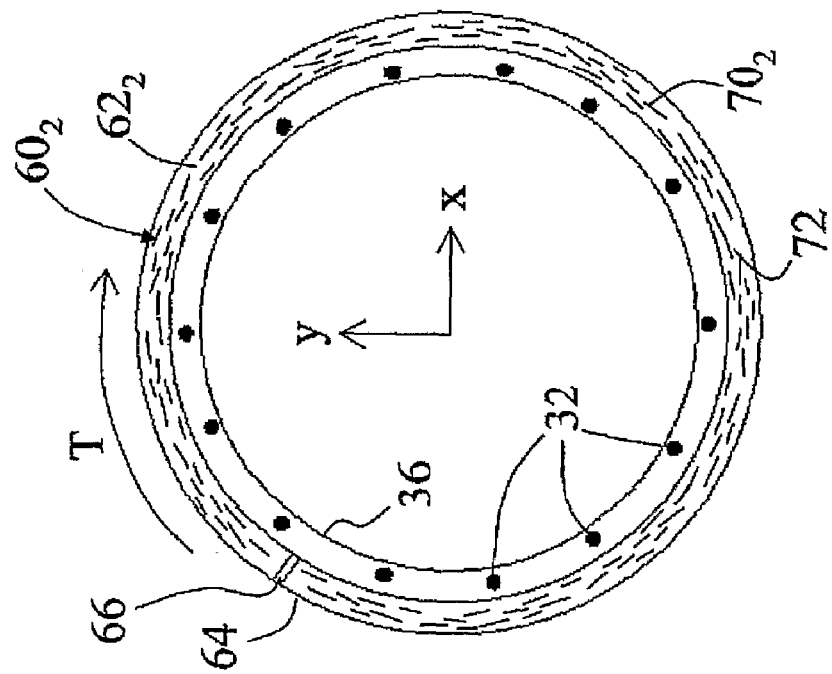

FIGS. 3A and 3B diagrammatically show end and side sectional views of a radio frequency birdcage coil with a magnetic field-modifying structure disposed between the birdcage rungs and the radio frequency screen, in which the field-modifying structure includes elongated ferromagnetic wires or rods dispersed in an insulating binder.

Figure 4B:
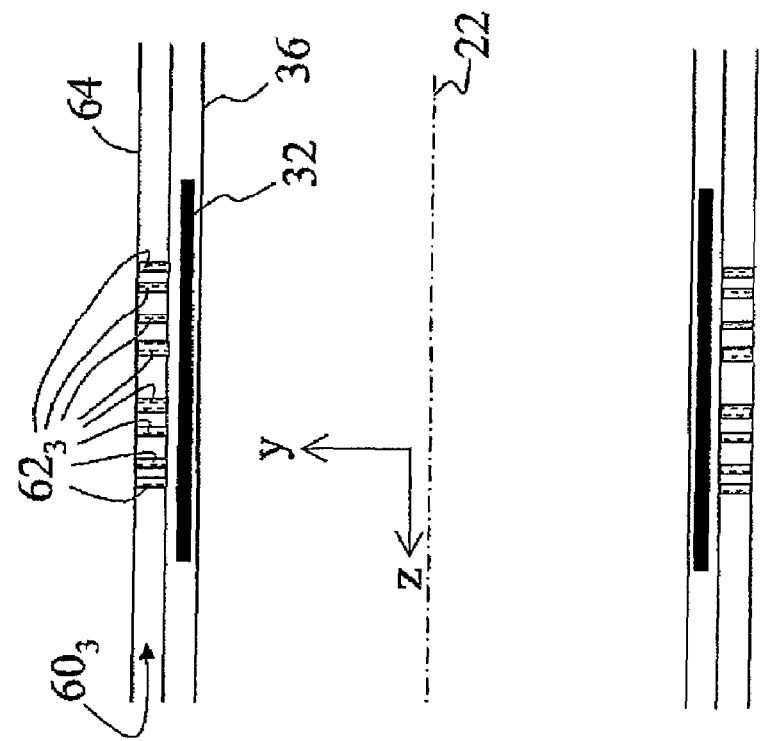
Figure 4A:
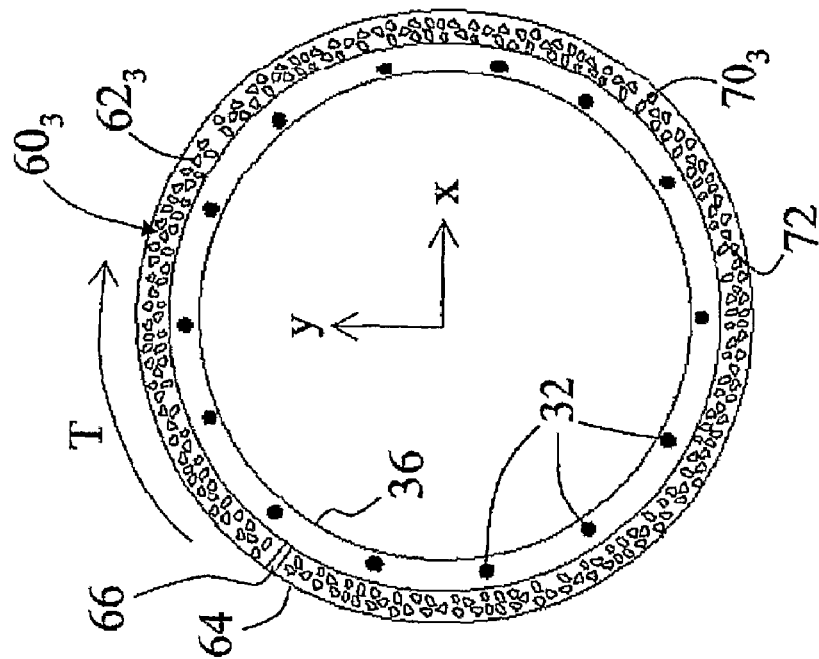

FIGS. 4A and 4B diagrammatically show end and side sectional views of a radio frequency birdcage coil with a magnetic field-modifying structure disposed between the birdcage rungs and the radio frequency screen, in which the field-modifying structure includes generally planar ferromagnetic plates dispersed in an insulating binder.

FIGS. 5A and 5B diagrammatically show end and side sectional views of a radio frequency birdcage coil with a magnetic field-modifying structure disposed between rungs of the birdcage coil, in which the magnetic field-modifying structure includes ferromagnetic particles dispersed in an insulating binder.

FIGS. 6A and 6B diagrammatically show end and side sectional views of a radio frequency birdcage coil with a magnetic field-modifying structure disposed between rungs of the birdcage coil, in which the magnetic field-modifying structure includes ferromagnetic annular rings shaped to promote tangential flux guiding.

FIG. 6C shows a perspective view of one of the ferromagnetic annular rings of FIGS. 6A and 6B, along with indications of the demagnetization factors in the z-direction and in the tangential direction.

With reference to FIG. 1, a magnetic resonance imaging scanner 10 includes a housing 12 defining a generally cylindrical scanner bore 14 inside of which an associated imaging subject 16 is disposed. Main magnetic field coils 20 are disposed inside the housing 12, and produce a temporally constant main $B_0$ magnetic field directed generally along and parallel to a central axis 22 of the scanner bore 14. The central axis 22 lies parallel to the z-direction in the reference x-y-z Cartesian coordinate system indicated in FIG. 1; however, other coordinate systems can be used. For example, a vertical magnet can be used, in which the temporally constant $B_0$ field is vertically oriented in the y-direction. The main magnetic field coils 20 are typically superconducting coils disposed inside cryoshrouding 24, although resistive permanent magnetic main magnets can also be used.

The housing 12 also houses or supports magnetic field gradient-generating structures, such as magnetic field gradient coils 30, for selectively producing magnetic field gradients parallel to the central axis 22 of the bore 14, along in-plane directions transverse to the central axis 22, or along other selected directions. The housing 12 further houses or supports a radio frequency body coil 32 for selectively exciting magnetic resonances. Specifically, the radio frequency body coil 32 produces a radio frequency $B_1$ magnetic field transverse to the static main $B_0$ magnetic field. The radio frequency $B_1$ magnetic field is generated at the Larmor frequency for exciting nuclear resonances. For exciting $^1H$ proton nuclei, the magnetic resonance Larmor frequency $f_{res}$ generally corresponds to $f_{res}=\gamma B_0$ where $\gamma=42.58$ MHz/Tesla is the gyrometric ratio for the $^1H$ nuclei and $B_0$ is the static main $B_0$ magnetic field. Thus, for example, at $B_0=3$ T, $f_{res}=128$ MHz. While $^1H$ proton nuclei exist in high concentrations in the human body and are commonly used for magnetic resonance imaging, other nuclear magnetic resonances can be similarly excited and imaged.

In the illustrated embodiment, the coil 32 is a birdcage coil. A coil array 34 is optionally disposed inside the bore 14 to receive magnetic resonance signals. The coil array 34 includes a plurality of coils, specifically four coils in the illustrated example coil array 34, although other numbers of coils can be used, including a single surface coil. Moreover, the optional coil array 34 can be omitted altogether, and the body coil 32 used for receiving magnetic resonance signals. The housing 12 typically includes a cosmetic inner liner 36 inside the birdcage coil 32 defining the scanner bore 14.

The main magnetic field coils 20 produce the main $B_0$ magnetic field parallel to the z-direction in the bore 14. A magnetic resonance imaging controller 40 operates magnetic field gradient controllers 42 to selectively energize the magnetic field gradient coils 30, and operates a radio frequency transmitter 44 coupled to the radio frequency coil 32 to selectively energize the radio frequency coil 32. By selectively operating the magnetic field gradient coils 30 and the radio frequency coil 32, magnetic resonance is generated and spatially encoded in at least a portion of a region of interest of the imaging subject 16. By applying selected magnetic field gradients via the gradient coils 30, a selected k-space trajectory is traversed during acquisition of magnetic resonance signals, such as a Cartesian trajectory, a plurality of radial trajectories, or a spiral trajectory. Alternatively, imaging data can be acquired as projections along selected magnetic field gradient directions. During imaging data acquisition, the magnetic resonance imaging controller 40 operates a radio frequency receiver 46 coupled to the coils array 34, as shown, or coupled to the whole body coil 32, to acquire magnetic resonance samples that are stored in a magnetic resonance data memory 50.

The imaging data are reconstructed by a reconstruction processor 52 into an image representation. In the case of k-space sampling data, a Fourier transform-based reconstruction algorithm can be employed. Other reconstruction algorithms, such as a filtered backprojection-based reconstruction, can also be used depending upon the format of the acquired magnetic resonance imaging data. The reconstructed image generated by the reconstruction processor 52 is stored in an image memory 54, and can be displayed on a user interface 56, stored in non-volatile memory, transmitted over a local intranet or the Internet, viewed, stored, manipulated, or so forth. The user interface 56 can also enable a radiologist, technician, or other operator of the magnetic resonance imaging scanner 10 to communicate with the magnetic resonance imaging controller 40 to select, modify, and execute magnetic resonance imaging sequences.

To stretch the static main $B_0$ magnetic field, to improve uniformity of the main $B_0$ magnetic field, or to otherwise modify or configure the main $B_0$ magnetic field, a magnetic field-modifying structure 60 which includes a plurality of ferromagnetic annular rings, specifically eight annular rings 62 in the embodiment illustrated in FIG. 1, are disposed in and designed to enhance the static main $B_0$ magnetic field. While eight annular rings 62 are illustrated, other numbers and/or placements of rings can be used. Moreover, a magnetic field-modifying structure including partial rings, rods, or other ferromagnetic structures may be employed. Typically, the number, distribution, shape, and other geometrical characteristics of the rings 62 of the magnetic field-modifying structure 60 are selected during concurrent design of the magnet 20. For example, these characteristics of the magnetic field-modifying structure 60 are suitably optimized during a finite element modeling optimization of the static magnetic field produced by the magnet 20 in conjunction with the magnetic field-modifying structure 60.

In FIG. 1, the magnetic field-modifying structure 60 is disposed between the radio frequency coil 32 and a radio frequency shield 64 of the radio frequency coil 32. In this position, it overlaps and interacts with the radio frequency $B_1$ magnetic field generated by the radio frequency coil 32. At typical magnetic resonance frequencies, such as the example 128 MHz resonance frequency for $^1H$ protons in a 3T static magnetic field, penetration of the radio frequency $B_1$ magnetic field into ferromagnetic materials is limited to a skin depth of typically about 10-20 microns or less. For example, using $f_{res}$=128 MHz, relative magnetic permeability $\mu_r \sim 1$ since the ferromagnetic material is in saturation, and a conductivity $\sigma \sim 1 \times 10^7$ S/m, the skin depth $\delta(f_{res})$ is approximately:

$$\delta(f_{res}) \cong \frac{1}{\sqrt{\pi f_{res} \mu_r \mu_o \sigma}} = 14 \, microns, \quad (1)$$

where $\mu_o = 4\pi \times 10^{-7}$ H/m is the magnetic permeability of free space and the product $\mu_r \mu_o$ is the absolute magnetic permeability of the ferromagnetic material. The magnetic field in a ferromagnetic particle having dimensions substantially larger than the skin depth is substantially expelled from the interior of the ferromagnetic particle. Such magnetic flux expulsion can adversely affect the performance of the radio frequency coil 32.

With reference to FIGS. 2A and 2B, in a first embodiment the magnetic field-modifying structure $60_1$ (where the subscript "1" on certain reference numbers of FIGS. 2A and 2B indicate components specific to the first described embodiment of the magnetic field-modifying structure 60) has ferromagnetic annular rings $62_1$ which are made up of ferromagnetic particles $70_1$ dispersed in an insulating binder 72. In one example embodiment, the ferromagnetic particles $70_1$ are pure iron particles, iron alloy particles such as iron-cobalt alloy particles, or the like, and the binder 72 is an electrically insulating non-magnetic material such as a polymer, resin or the like.

To substantially reduce flux expulsion of the radio frequency $B_1$ magnetic field from the ferromagnetic particles $70_1$, the particles are generally smaller in at least one dimension (for example, at least one of length, width, and depth, or an annular cross-sectional dimension of ring-shaped particles) than a skin depth of the radio frequency $B_1$ magnetic field in the ferromagnetic material, to allow the radio frequency $B_1$ magnetic field to enter the ferromagnetic particles $70_1$. The phrase "generally smaller than" the skin depth recognizes that the particles $70_1$ may have a statistical size distribution in which some particles may be larger than the skin depth. In such cases, the statistical distribution is such that most of the particles are smaller in the at least one dimension than the skin depth, so that flux expulsion is substantially reduced.

The ferromagnetic annular rings $62_1$ include ferromagnetic particles $70_1$ that generally do not have a direction of elongation, and are thus generally smaller than the skin depth of the radio frequency $B_1$ magnetic field in the ferromagnetic material in all dimensions. The flux expulsion decreases as the size of the ferromagnetic particles $70_1$ decreases. In one specific embodiment, the ferromagnetic particles $70_1$ are generally smaller than about one-tenth of the skin depth of the radio frequency field. In another specific embodiment, the ferromagnetic particles $70_1$ are generally smaller than about 10 microns, which corresponds to the skin depth of typical ferromagnetic materials at typical magnetic resonance frequencies. In yet another specific embodiment, the ferromagnetic particles $70_1$ are generally smaller than about 4 microns, which corresponds to about one-third of the skin depth of typical ferromagnetic materials at typical magnetic resonance frequencies.

The fill factor of the ferromagnetic particles $70_1$ dispersed in the binder 72 should be high enough to provide the desired magnetic field modification of the static $B_0$ magnetic field. In one embodiment, the fill factor is at least about 50% by volume. The fill factor of a specific embodiment determines the ferromagnetic properties of the annular rings $62_1$. The fill factor is, in turn, used in designing the magnetic field-modifying structure. The magnetic field-modifying structure $60_1$ is designed to enhance the main $B_0$ magnetic field. This design can be performed concurrently with design of the main magnetic field coils 20, for instance by a finite element model optimization incorporating both the magnetic field coils 20 and the magnetic field-modifying structure $60_1$. Alternatively or in addition, the structure $60_1$ or portions thereof can be designed empirically, for example by empirical shimming of the manufactured magnet to correct the static $B_0$ magnetic field for manufacturing flaws. Regardless of how and when the design is performed, the design of the magnetic field modifying structure $60_1$ incorporates the specific ferromagnetic properties of the ferromagnetic particles $70_1$ dispersed in the binder 72.

With reference to FIGS. 3A and 3B, in a second embodiment, the magnetic field-modifying structure $60_2$ (where the subscript "2" on certain reference numbers of FIGS. 3A and 3B indicate components specific to the second described embodiment of the magnetic field-modifying structure 60) has ferromagnetic annular rings $62_2$ which are made up of elongated ferromagnetic particles $70_2$, such as rods, cigar-shaped particles, or wires of ferromagnetic material, dispersed in an insulating binder 72. The elongated ferromagnetic particles $70_2$ can be, for example, iron filings or iron whiskers. The magnetic field-modifying structure $60_2$ of FIGS. 3A and 3B differs from the magnetic field-modifying structure $60_1$ of FIGS. 2A and 2B in that the geometrically isotropic ferromagnetic particles $70_1$ of FIGS. 2A and 2B have been replaced by elongated ferromagnetic particles $70_2$ shown in FIGS. 3A and 3B.

To substantially reduce flux expulsion of the radio frequency $B_1$ magnetic field from the ferromagnetic particles $70_2$, a cross-sectional dimension (for example, the wire diameter in the case of round wires) of the elongated ferromagnetic particles $70_2$ are generally smaller than the skin depth of the radio frequency $B_1$ magnetic field in the ferromagnetic material. In one specific embodiment, the elongated ferromagnetic particles $70_2$ have cross-sectional dimensions that are generally smaller than about one-tenth of the skin depth of the radio frequency field. In another specific embodiment, the cross-sections are generally smaller than about 10 microns. In yet another specific embodiment, the cross-sections of the particles $70_2$ are generally smaller than about 4 microns. The fill factor of the ferromagnetic particles $70_2$ dispersed in the binder 72 is at least about 50% by volume.

In FIGS. 3A and 3B, the elongated ferromagnetic particles $70_2$ are shown substantially aligned with the tangential direction (designated by a curved arrow labeled "T" in the drawings). The tangential direction is spatially dependent. The tangential direction is everywhere transverse to the z-direction. The tangential direction is also at each point in space transverse to a radial direction parallel to the x-y plane and directed from the central axis 22 to that point in space.

The tangential alignment of the elongated ferromagnetic particles $70_2$ can be achieved, for example, by dispersing the elongated ferromagnetic particles $70_2$ in the binder with the binder in a liquid form, and applying an aligning magnetic field while the binder is cured or otherwise solidified. As will be discussed later, the tangential orientation of the elongated ferromagnetic particles $70_2$ shown in FIGS. 3A and 3B can provide advantageous magnetic flux guiding. However, in other contemplated embodiments, the orientation of the elongated ferromagnetic particles $70_2$ is substantially random.

Moreover, FIG. 3A illustrates that the annular rings 62 can be discontinuous. For example, FIG. 3A shows a gap 66 in the rings $62_2$. Although gaps such as the gap 66 can be included, for flux-guiding embodiments such gaps should be relatively few, and each gap should be narrow.

With reference to FIGS. 4A and 4B, in a third embodiment, the magnetic field-modifying structure $60_3$ (where the subscript "3" on certain reference numbers of FIGS. 4A and 4B indicate components specific to the third described embodiment of the magnetic field-modifying structure 60) has ferromagnetic annular rings $62_3$ which are made up of generally planar ferromagnetic particles $70_3$, such as plates or disks of ferromagnetic material, dispersed in an insulating binder 72. It will be appreciated that the magnetic field-modifying structure $60_3$ of FIGS. 4A and 4B differs from the magnetic field-modifying structure $60_1$ of FIGS. 2A and 2B in that the geometrically isotropic particles $70_1$ of FIGS. 2A and 2B have been replaced by the generally planar particles $70_3$ shown in FIGS. 4A and 4B.

To substantially reduce flux expulsion of the radio frequency $B_1$ magnetic field from the generally planar ferromagnetic particles $70_3$, the thickness of the generally planar ferromagnetic particles $70_3$ are generally smaller than the skin depth of the radio frequency B, magnetic field in the ferromagnetic material. In one specific embodiment, the generally planar ferromagnetic particles $70_3$ have thicknesses that are generally less than about one-tenth of the skin depth of the radio frequency field. In another specific embodiment, the thicknesses are generally less than about 10 microns. In yet another specific embodiment, the thicknesses of the particles $70_3$ are generally less than about 4 microns. The fill factor of the ferromagnetic particles $70_2$ dispersed in the binder 72 is at least about 50% by volume.

In FIGS. 4A and 4B, the generally planar ferromagnetic particles $70_3$ are shown with planar normals substantially aligned parallel with the z-direction which corresponds to the direction of the main $B_0$ magnetic field, and transverse to the tangential direction. Such alignment can be achieved, for example, by dispersing the generally planar ferromagnetic particles $70_3$ in the binder with the binder in a liquid form, and applying an aligning magnetic field while the binder is cured or otherwise solidified. As will be discussed later, the orientation of the generally planar ferromagnetic particles $70_3$ shown in FIGS. 4A and 4B can provide advantageous magnetic flux guiding. However, in other contemplated embodiments, the orientation of the generally planar ferromagnetic particles $70_3$ is substantially random. Random orientation of the generally planar ferromagnetic particles $70_3$ is particularly suitable when the cross-sectional area of the generally planar ferromagnetic particles $70_3$ is relatively small.

With reference to FIGS. 5A and 5B, in a fourth embodiment, the magnetic field-modifying structure $60_4$ (where the subscript "4" on certain reference numbers of FIGS. 5A and 5B indicate components specific to the fourth described embodiment of the magnetic field-modifying structure 60) has ferromagnetic annular rings $62_4$ which are made up of generally geometrically isotropic planar particles $70_4$, such as particles similar to the particles $70_1$ of the first embodiment of FIGS. 2A and 2B, dispersed in an insulating binder 72. The ferromagnetic annular rings $62_4$ differ from the annular rings $62_1$ of the first embodiment in that the annular rings $62_4$ are disposed at about the same radial position (respective to the central axis 22) as the rungs of the birdcage coil 32. To accommodate the overlap between the annular rings $62_4$ and the rungs of the birdcage coil 32, the ferromagnetic annular rings $62_4$ each include gaps 68 in which the rungs are disposed. In other words, the ferromagnetic material of the annular rings $62_4$ is disposed between the rungs of the birdcage coil 32. This arrangement enables the gap between the rungs of the birdcage coil 32 and the radio frequency screen 64 to be narrowed versus the first embodiment. Alternatively, continuous annular ring portions can extend around the rungs of the birdcage coil radially inward of the rungs, outward of the rungs, or both.

With reference to FIGS. 6A, 6B, and 6C, in a fifth embodiment, the magnetic field-modifying structure $60_5$ (where the subscript "5" on certain reference numbers of FIGS. 6A, 6B, and 6C indicate components specific to the fifth described embodiment of the magnetic field-modifying structure 60) has ferromagnetic annular rings $62_5$ which are made up of ferromagnetic material not dispersed as particles in a binder. For example, the ferromagnetic annular rings $62_5$ may be solid or laminated iron rings, iron-alloy rings, or rings of another ferromagnetic material. The rings $62_5$ preferably form complete circuits in the tangential direction; however, one or a few narrow gaps such as the gap 66 may be included.

The magnetic field-modifying structure $60_5$ includes annular rings $62_5$ that promote tangential flux guiding. The magnetic field $H_{obj}$ in an ferromagnetic object responsive to an applied external field $H_{ext}$ is given by:

$$H_{obj}=H_{ext}-NM_{sat} \qquad (2),$$

where $M_{sat}$ is the saturation magnetization and N is the demagnetization factor. The term $NM_{sat}$ is called the demagnetization field, and for ferromagnetic materials is directed opposite to the applied external field $H_{ext}$. The saturation magnetization $M_{sat}$ is a characteristic of the material, and the demagnetization factor N is a characteristic of the physical geometry of the object.

For example, a spherical object has an isotropic demagnetization factor N which is independent of direction. A wire- or rod-shaped object has a demagnetization factor component of about zero for applied external field directed parallel to the wire or rod, and a non-zero demagnetization factor component for applied external field directed parallel to the wire or rod. A generally planar object has a demagnetization factor component of about zero for in-plane directions, and a non-zero demagnetization factor component in the direction of the planar normal, that is, transverse to the plane. In general, the demagnetization factor N has larger components in directions of small spatial extent, and smaller components in directions of large spatial extent.

With particular reference to FIG. 6C, the ferromagnetic annular rings $62_5$ have a thickness $d_z$ in the z-direction which is thin relative to the width $d_r$ of the annular ring $62_5$ in a radial direction transverse to the tangential direction. The extent of the annular ring $62_5$ in the tangential direction for a continuous ring or for a ring with one or a few narrow gaps 66 is larger than either the thickness $d_z$ or the width $d_r$. Because of the small thickness $d_z$ relative to the extended nature of the annular rings $62_5$ in the tangential direction, the demagnetization factor component $N_z$ in the z-direction is substantially larger than the demagnetization factor component $N_T$ in the tangential direction. That is, $N_z \gg N_T$. This is indicated in FIG. 6C by using a thin short arrow to designate NT and a long thick arrow to indicate $N_z$. For an isotropic saturation magnetization $M_{sat}$, therefore, the magnetic flux in the annular rings $62_5$ is preferentially guided in the tangential direction. In the z-direction, the relatively large $N_z$ subtracts from the flux producing reduced magnetic flux in the z-direction.

To provide a numerical example, for $N_T \cong 0$ due to the large tangential extent, a relatively large demagnetization factor component $N_z=0.5$ in the z-direction due to the small thickness $d_z$, and a ferromagnetic material having a saturation magnetization $M_{sat}=2$ T/$\mu_o$, applying Equation (2) in the z-direction gives:

$$H_{obj,z}=H_{ext,z}-N_z M_{sat}=H_{ext,z}-1 \text{ T}/\mu_o \quad (3).$$

Applying Equation (2) in the tangential direction gives:

$$H_{obj,T}=H_{ext,T}-N_T M_{sat}=H_{ext,T} \quad (4).$$

Equations (3) and (4) show that the z-component of the magnetic field in the annular rings $62_5$ is suppressed by the subtractive factor 1 T/$\mu_o$, whereas the tangential component of the magnetic field is not suppressed, producing preferential flux guiding in the tangential direction. If the result of Equation (3) drops below 1 T/$\mu_o$, then the material is not in saturation in the z-direction.

The annular rings $62_5$ of the flux-guiding fifth embodiment are made up of ferromagnetic material not dispersed as particles in a binder. In other contemplated flux-guiding embodiments, the ferromagnetic rings may be made of ferromagnetic particles dispersed in a binder. For example, the annular rings $62_1$, $62_2$, $62_3$ of the first, second, and third embodiments, respectively, can provide flux guiding if the annular rings are made thin in the z-direction compared with the width of the rings in the radial direction. In contemplated embodiments, the rings are less than a few centimeters thick in the z-direction, and more preferably are a few millimeters thick in the z-direction, to provide a substantial demagnetization factor component in the z-direction.

The second embodiment $60_2$ has elongated ferromagnetic particles $70_2$ that are advantageously oriented to promote the tangential flux guiding. The elongated direction of the elongated ferromagnetic particles $70_2$ is parallel to the tangential direction, which results in a small tangential demagnetization factor component. In the z-direction, the tangentially oriented elongated ferromagnetic particles $70_2$ present a thin dimension which enhances the demagnetization factor component in the z-direction, thus suppressing the z-component of the magnetic field in the particles $70_2$. Thus, if the annular rings $62_2$ are designed to be thin in the z-direction relative to a width of the rings in the radial direction, the annular rings $62_2$ typically provide tangential flux guiding.

Similarly, the third embodiment $60_3$ has generally planar ferromagnetic particles $70_3$ that are advantageously oriented to promote the tangential flux guiding. The tangential direction lies in the plane of the generally planar ferromagnetic particles $70_3$, which results in a small tangential demagnetization factor component. The planar normal of the generally planar ferromagnetic particles $70_3$ lies along the z-direction, so that the particles $70_3$ are thin in the z-direction which enhances the demagnetization factor component in the z-direction, thus suppressing the z-component of the magnetic field in the particles $70_3$. Thus, if the annular rings $62_3$ are designed to be thin in the z-direction relative to a width of the rings in the radial direction, the annular rings $62_3$ typically provide tangential flux guiding.

The annular rings $62_4$ of the fourth embodiment generally provide limited tangential flux guiding since the rings are broken by the gaps 68. If the segments of the annular rings $62_4$ between the gaps 68 are extended in the tangential and radial directions compared with the thickness of the annular rings $62_4$ in the z-direction, some tangential flux guiding may be achieved.

Embodiments of the magnetic field-modifying structure 60 which promote tangential flux guiding of the radio frequency $B_1$ field will also produce some preferential tangential flux guiding of the magnetic field gradients produced by the magnetic field gradient coils 30. Since the magnetic field gradients are imposed on the main $B_0$ magnetic field which is directed in the z-direction, the magnetic field gradients typically have small or non-existent components in the tangential direction at the position of the magnetic field-modifying structure 60. Moreover, tangential flux guiding of the gradient fields can be further suppressed by including the magnetic field-modifying structure 60 in the design of the gradient coils 30. For example, the magnetic field-modifying structure 60 can be incorporated into a finite element model optimization of the gradient coils geometry.

Although the example magnetic field-modifying structures 60 have been described with reference to a horizontal closed cylindrical magnet 20, the described embodiments are readily adapted to other magnetic resonance imaging scanners such as vertical magnet scanners, asymmetric scanners, open scanner geometries, and the like.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

Having described the preferred embodiments, the invention is now claimed to be:

1. A magnetic resonance imaging scanner comprising:
   a magnet generating a temporally constant magnetic field;
   one or more magnetic field gradient generating structures superimposing selected magnetic field gradients on the temporally constant magnetic field;
   a radio frequency shield;
   a radio frequency coil disposed inside of the radio frequency shield and selectively producing a radio frequency field; and
   a magnetic field modifying structure designed to enhance the temporally constant magnetic field, the magnetic field modifying structure being disposed inside of the radio frequency shield and including particles of magnetic material generally smaller in at least one dimension than a skin depth of the radio frequency field in the magnetic material dispersed in an insulating binder.

2. The magnetic resonance imaging scanner as set forth in claim 1, wherein the particles of magnetic material dispersed in the binder have a fill factor of at least about 50% by volume.

3. The magnetic resonance imaging scanner as set forth in claim 1, wherein the particles of magnetic material are generally smaller in at least one dimension than about one tenth of the skin depth of the radio frequency field in the magnetic material.

4. The magnetic resonance imaging scanner as set forth in claim 1, wherein the particles of magnetic material are generally smaller than about 10 microns in at least one dimension.

5. The magnetic resonance imaging scanner as set forth in claim 1, wherein the particles of magnetic material are generally smaller than about 4 microns in at least one dimension.

6. The magnetic resonance imaging scanner as set forth in claim 1, wherein the particles of magnetic material generally do not have a direction of elongation.

7. The magnetic resonance imaging scanner as set forth in claim 1, wherein the particles of magnetic material are generally wire shaped.

8. The magnetic resonance imaging scanner as set forth in claim 7, wherein the generally wire shaped particles are oriented with long directions generally transverse to the temporally constant magnetic field and generally parallel to a direction tangential to an annular structure around the temporally constant magnetic field.

9. The magnetic resonance imaging scanner as set forth in claim 1, wherein the particles of magnetic material are generally planar.

10. The magnetic resonance imaging scanner as set forth in claim 9, wherein the generally planar particles are oriented with plane normals generally parallel to the temporally constant magnetic field.

11. The magnetic resonance imaging scanner as set forth in claim 1, wherein the radio frequency coil includes a plurality of parallel rungs, and the particles of magnetic material are disposed at least partially between the rungs.

12. The magnetic resonance imaging scanner as set forth in claim 1, wherein the magnetic field modifying structure includes:
a plurality of generally annular structures containing particles of magnetic material, the generally annular structures being oriented generally transverse to the temporally constant magnetic field, the annular structures having annular cross sections elongated transverse to the temporally constant magnetic field.

13. The magnetic resonance imaging scanner as set forth in claim 1, wherein the magnetic field modifying structure includes:
a plurality of magnetic generally annular structures containing the particles of magnetic material in the insulating binder, the magnetic generally annular structures being oriented generally transverse to the temporally constant magnetic field, the magnetic annular structures having a longitudinal demagnetization factor parallel to the temporally constant magnetic field and a tangential demagnetization factor in a tangential direction transverse to the temporally constant magnetic field, the longitudinal demagnetization factor being larger than the tangential demagnetization factor to produce tangential flux guiding.

14. The magnetic resonance imaging scanner as set forth in claim 1, wherein the magnetic field modifying structure has a longitudinal demagnetization factor parallel to the temporally constant magnetic field and a tangential demagnetization factor in a tangential direction transverse to the temporally constant magnetic field, the longitudinal demagnetization factor being larger than the tangential demagnetization factor to produce tangential flux guiding.

15. A magnetic resonance imaging scanner comprising:
a magnet generating a temporally constant magnetic field;
one or more magnetic field gradient-generating structures superimposing selected magnetic field gradients on the temporally constant magnetic field;
a radio frequency coil selectively producing a radio frequency field; and
a magnetic field-modifying structure designed to enhance the temporally constant magnetic field, the magnetic field-modifying structure having a longitudinal demagnetization factor parallel to the temporally constant magnetic field and a tangential demagnetization factor in a tangential direction transverse to the temporally constant magnetic field, the longitudinal demagnetization factor being larger than the tangential demagnetization factor to produce tangential flux guiding, wherein the magnetic field-modifying structure includes:
ferromagnetic particles that are generally smaller than a skin depth of the radio frequency field in the magnetic material in at least one dimension; and
an insulating binder in which the ferromagnetic particles are dispersed.

16. The magnetic resonance imaging scanner as set forth in claim 15, wherein the magnetic field modifying structure includes:
a plurality of generally annular structures oriented generally transverse to the temporally constant magnetic field, the annular structures having annular cross sections elongated transverse to the temporally constant magnetic field.

17. The magnetic resonance imaging scanner as set forth in claim 15, wherein the ferromagnetic particles are dispersed in the binder with a fill factor greater than 50% by volume.

18. The magnetic resonance imaging scanner as set forth in claim 15, wherein the ferromagnetic particles have an anisotropic particle demagnetization factor with a largest particle demagnetization factor component generally oriented in the direction of the temporally constant magnetic field and a smaller particle demagnetization factor component oriented in a tangential direction transverse to the direction of the temporally constant magnetic field.

* * * * *